United States Patent
Chen et al.

(10) Patent No.: US 7,335,599 B2
(45) Date of Patent: Feb. 26, 2008

(54) METHOD AND APPARATUS FOR MAKING COPLANAR ISOLATED REGIONS OF DIFFERENT SEMICONDUCTOR MATERIALS ON A SUBSTRATE

(75) Inventors: Howard Hao Chen, Yorktown Heights, NY (US); Louis Lu-Chen Hsu, Fishkill, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/254,044

(22) Filed: Oct. 19, 2005

(65) Prior Publication Data
US 2007/0087525 A1 Apr. 19, 2007

Related U.S. Application Data

(63) Continuation-in-part of application No. 11/218,198, filed on Sep. 1, 2005.

(51) Int. Cl.
*H01L 21/4763* (2006.01)

(52) U.S. Cl. ............ 438/691; 438/421; 438/411; 257/276

(58) Field of Classification Search ............ 438/411, 438/422, 421, 218, 226, 294, 413, 319, 412, 438/619, 584, 597; 257/276, E23.013, E21.573, 257/522
See application file for complete search history.

(56) References Cited

U.S. PATENT DOCUMENTS

| | | | | |
|---|---|---|---|---|
| 4,169,000 A | * | 9/1979 | Riseman | 438/422 |
| 5,480,832 A | * | 1/1996 | Miura et al. | 438/404 |
| 6,635,534 B2 | * | 10/2003 | Madson | 438/270 |
| 2002/0006715 A1 | * | 1/2002 | Chhagan et al. | 438/585 |
| 2005/0030780 A1 | * | 2/2005 | Deppe et al. | 365/123 |

* cited by examiner

*Primary Examiner*—W. David Coleman
*Assistant Examiner*—Su C. Kim
(74) *Attorney, Agent, or Firm*—Brain P. Verminski

(57) ABSTRACT

A semiconductor processing method includes providing a substrate, forming a plurality of semiconductor layers in the substrate, each of the semiconductor layers being distinct and selected from different groups of semiconductor element types. The semiconductor layers include a first, second, and third semiconductor layers. The method further includes forming a plurality of lateral void gap isolation regions for isolating portions of each of the semiconductor layers from portions of the other semiconductor layers.

7 Claims, 10 Drawing Sheets

METHOD AND APPARATUS FOR MAKING COPLANAR ISOLATED REGIONS OF DIFFERENT SEMICONDUCTOR MATERIALS ON A SUBSTRATE

CROSS-REFERENCE TO RELATED APPLICATIONS

The application is a continuation-in-part of a related application entitled "Method and apparatus for making coplanar dielectrically-isolated regions of different semiconductor materials on a substrate" having application Ser. No. 11/218,198, filed on Sep. 1, 2005, the entire contents of the application being incorporated herein by reference.

BACKGROUND OF THE INVENTION

1. Field of the Invention

The invention pertains to semiconductor processing methods and semiconductor constructions. In particular aspects, the invention pertains to a method and apparatus to integrate and fabricate coplanar void-isolated regions of different semiconductor materials on a hybrid monolithic substrate.

2. Description of Related Art

The need for semiconductor substrates having regions of multiple crystal orientations (e.g., <100> versus <110> versus <111>), or regions of a mixture of silicon-on-insulator (SOI) and bulk, or regions of different semiconductor type materials (e.g., Si or Ge type IV versus compound semiconductor materials) is well recognized by persons skilled in the art of semiconductor industry.

With respect to substrates having multiple crystal orientations, NFETs benefit from increased electron mobility in <100> oriented substrates while PFETs are observed to have increased hole mobility in <110> oriented substrates. The hole mobility was reported to be double in <110> oriented substrates relative to <100> oriented substrates. Further, in such multiple crystal orientation substrates, it is undesirable to have all the regions to be bulk substrates or SOI substrates. Bulk and SOI substrates each have preferred product applications. For example, SOI substrates provide reduced junction capacitance, dynamic threshold voltage ($V_t$), and drain current enhancement due to gate to body coupling, and such properties are desired for high performance CMOS applications.

However, floating body effects of SOI substrates can result in unacceptable leakage currents and data retention problems for DRAM semiconductor types.

There is a further need for substrates having regions of different semiconductor material types. Semiconductor devices fabricated on silicon (group IV) substrates are abundantly employed in high-volume low-cost microelectronics where high-density, high-performance, and low-power consumption are simultaneously desired. CMOS, bipolar, and BICMOS technologies fabricated on either bulk silicon or silicon on insulator (SOI) substrates are commonly used in microprocessor, memory, and analog electronics applications.

Optoelectronic devices that are commonly used include III-V and II-VI compound semiconductor materials such as GaAs, InP, InGaP, InAs, AlGaAs, GaN, GaInAs, and AlGaSb. These compound semiconductor materials possess direct band gap properties and high photo-emission efficiency. Further, electronic properties of compound semiconductor materials make them ideal candidates for optoelectronics products such as LEDs, VCELs, photovoltaic devices, as well as high performance microwave devices such as PIN diodes, and heterojunction bipolar transistors (HBTs). Thus, semiconductor substrates having a mixture of group IV semiconductor material and compound semiconductor material are highly desirable.

Designers, however, face persistent problems in integrating electronic and optoelectronic devices from multiple types of semiconductor materials into a single compact, high-performance and cost effective package. One such problem encountered by hybrid substrates as noted above is a high density of stress induced semiconductor crystal defects related to the fabrication process. Particularly, the epitaxial growth process used to form substrates of the hybrid type result in adjacent semiconductor regions having different coefficients of thermal expansion or different oxidation properties. During the course of subsequent processing, compressive stresses may develop in the hybrid substrate structure which can result in crystal dislocations.

Therefore, there is a need to overcome the above-noted problems to produce hybrid substrates having reduced concentration of crystal defects.

SUMMARY OF THE INVENTION

Various embodiments of the invention disclose a monolithic substrate having a plurality of coplanar regions of different semiconducting materials, wherein each of the coplanar regions being isolated by a void (e.g., gap).

Aspects of the invention provide a structure and method of making a hybrid semiconductor substrate having voids between adjacent semiconductor regions. The voids allow the volume expansion of the semiconductor regions without the build-up of mechanical stress.

In one aspect, a semiconductor processing method includes providing a substrate, forming a plurality of semiconductor layers in the substrate, each of the semiconductor layers being distinct and selected from different groups of semiconductor element types. The semiconductor layers include a first, second, and third semiconductor layers. The method further includes forming a plurality of lateral void gap isolation regions for isolating portions of each of the semiconductor layers from portions of the other semiconductor layers.

In another aspect, a semiconductor construction includes a semiconductor substrate, a plurality of semiconductor layers provided in the semiconductor substrate, each of the semiconductor layers being selected from different groups of semiconductor element types, a plurality of semiconductor regions formed from the plurality of semiconductor layers, the plurality of semiconductor regions have coplanar top surfaces. The semiconductor construction further includes a plurality of lateral void gap isolation regions, each of the lateral void gap isolation regions being formed in an aperture in the semiconductor substrate and configured to isolate portions of each of the semiconductor layers from portions of the other semiconductor layers.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The invention encompasses methods to integrate and fabricate coplanar regions of different semiconductor materials on a hybrid monolithic substrate, the coplanar regions being separated by sealed voids. A method of the present invention is described with references to FIGS. 1-13. In referring to FIGS. 1-13, similar numbering will be used to identify similar elements, where appropriate.

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In exemplary constructions, a substrate can comprise various conductive, semiconductive, and insulative semiconductor device components (not shown), in addition to monocrystalline silicon.

Figure 1:
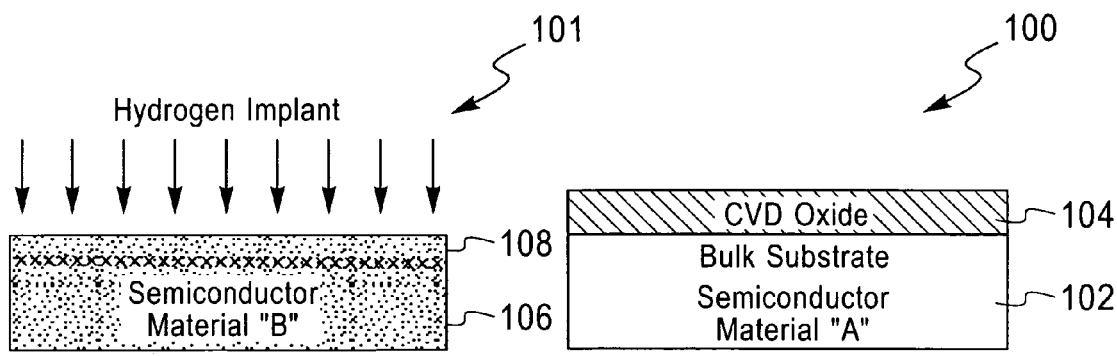
FIG. 1 is a diagrammatic, cross-sectional view of two different fragments of semiconductor wafers at a preliminary processing step where one of the semiconductor wafers is subjected to a shallow hydrogen implant in accordance with an embodiment of the invention.

Referring initially to FIG. 1, two different fragments of semiconductor constructions 100 and 101 are illustrated. Construction 100 includes a substrate 102 comprising a semiconductor material of a first type (e.g., first element type). Construction 101 includes a substrate 106 comprising a semiconductor material of a second type (e.g., second element type). In some embodiments, the semiconductor material of the first type is referred to as semiconductor material "A" and the semiconductor material of the second type is referred to as "semiconductor material "B."

The semiconductor material for the substrate 102 can be selected from group IV of the periodic table of elements. For example, the substrate 102 can comprise silicon. The semiconductor material for the substrate 106 and semiconductor material 404 (FIG. 4) can comprise a compound semiconductor selected from groups III-V or II-VI of the periodic table of elements. For example, the semiconductor material for the substrate 106 can comprise GaAs, InP, or other compound semiconductor materials like AlGaAs, AlInP, etc. Dissimilar semiconductor element types are defined as semiconductor materials selected from different groups of periodic table of elements. For example, if semiconductor material 102 is a Group IV material, then semiconductor material 106 can be material from group II-VI, and semiconductor material 404 can be material from group III-V of the periodic table of elements.

A layer of oxide 104 is grown over the substrate 102. The oxide layer 104 can be formed by any one or combination of well known methods such as chemical vapor deposition (CVD) or thermal oxidation. Other suitable dielectric materials can also be used for the oxide layer 104. In one example, the thickness of the oxide layer 104 preferably ranges from 5 nm to 100 nm. A shallow implant of hydrogen, or other species configured to induce lattice damage over a narrow depth, is made into the substrate 106.

The use of hydrogen implant for inducing a separation boundary between a thin upper region 108 and the substrate 106 is known by those skilled in the area of "Smartcut" process as disclosed in U.S. Pat. No. 5,374,564, the contents of which are incorporated herein by reference. Such details of the hydrogen implant will not be explained in detail herein. The temperature at which the shallow hydrogen implant is performed is preferably maintained below 500° C. in order to prevent formation of microbubbles and premature separation.

Figure 2:
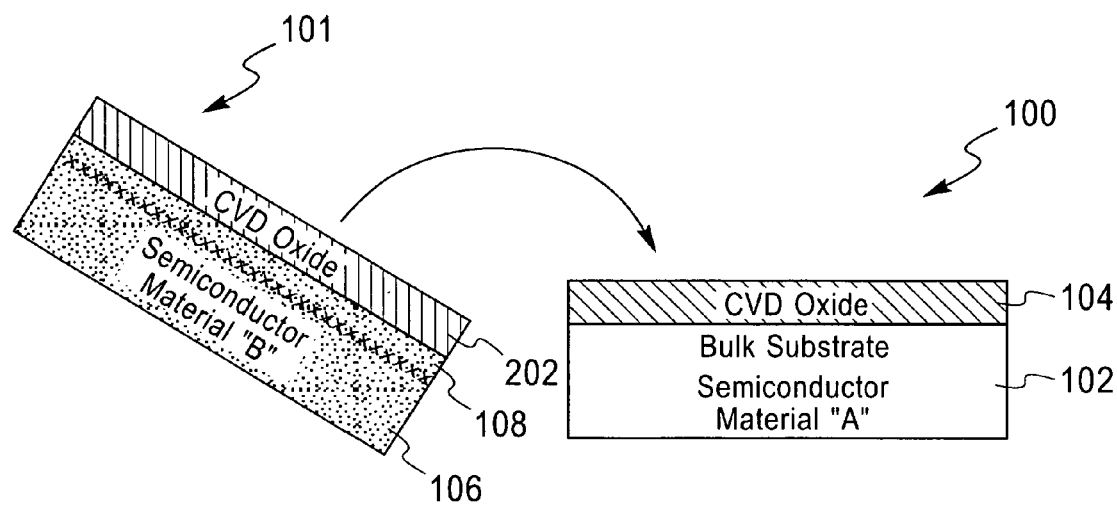
FIG. 2 is a view of the FIG. 1 fragment shown at a processing step subsequent to that of FIG. 1.

FIG. 2 is a view of the FIG. 1 fragment shown at a processing step subsequent to that of FIG. 1. An oxide layer 202 is formed on the surface of the substrate 106. The thickness of the oxide layer 202 preferably ranges from 5 nm to 100 nm.

Figure 3:
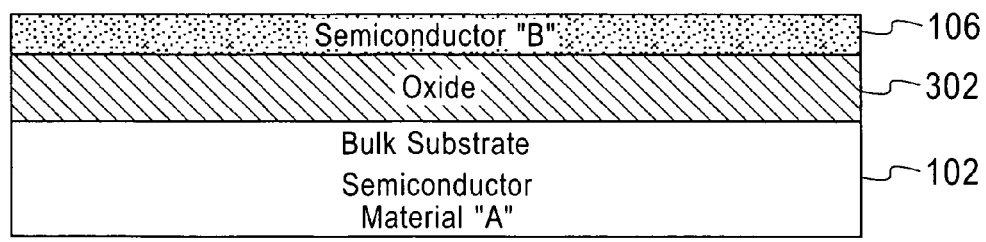
FIG. 3 is a view of the FIG. 2 fragment shown at a processing step subsequent to that of FIG. 2 wherein one of the semiconductor substrates is flipped and placed in contact with another semiconductor substrate.

The construction 101 comprising the substrate 106 is then flipped and placed in contact with the construction 100 such that the oxide layer 104 is contact with the oxide layer 202. The constructions 100 and 101 now form an integrated semiconductor construction 300 (FIG. 3). An anneal is then performed to bond the oxide layers 104, 202 to each other to form an single oxide layer 302 as illustrated in FIG. 3. The anneal also separates the semiconductor substrate 106 comprising semiconductor material of the second type from the remainder of the semiconductor construction 300 comprising the oxide layer 302 and the substrate 102. The temperature of the anneal preferably ranges from 800° C. to 1100° C. The oxide layer 302 comprises borophosphosilicate glass (BPSG), or other suitable reflowable oxide. The composition of the oxide layers 104, 202 can be tailored to facilitate bonding and reflow at relatively low anneal temperatures in order to form the oxide layer 302. The surface of semiconducting material "B" also referred to as substrate 106 is polished. For example, CMP polishing can be used.

In one embodiment, a thin (e.g., 1 nm-10 nm) nitride barrier layer (not shown) may be deposited on the surface of each of the constructions 100 and 101 prior to CVD oxide deposition. One purpose of the nitride barrier layer is to inhibit diffusion of boron or phosphorus from the BPSG comprised in the oxide layers (e.g., 104, 202) into the respective semiconductor materials (e.g., 102, 106).

Figure 4:
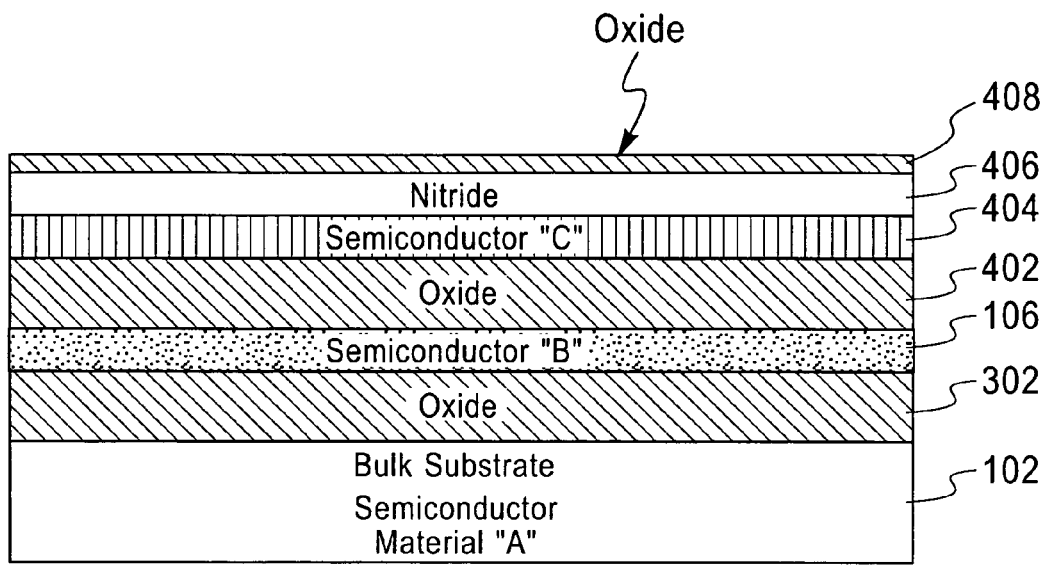
FIG. 4 is a view of the FIG. 3 fragment shown at a processing step subsequent to that of FIG. 3.

Referring to FIG. 4, another oxide layer 402 (FIG. 4) is then formed on the surface of semiconducting material 106. A layer of semiconducting material 404 (e.g., semiconductor material C) is formed over the oxide layer 402. Forming of the semiconducting material 404 over the semiconducting substrate 106 is performed similar to the process used for forming the semiconductor construction 101 over the semiconductor construction 100 as illustrated in FIG. 2 and described above. The semiconducting layer 404 is then subjected to a bonding and separation process similar to the bonding of the constructions 100 and 101. The surface of the semiconducting material 404 is polished.

Figure 10:
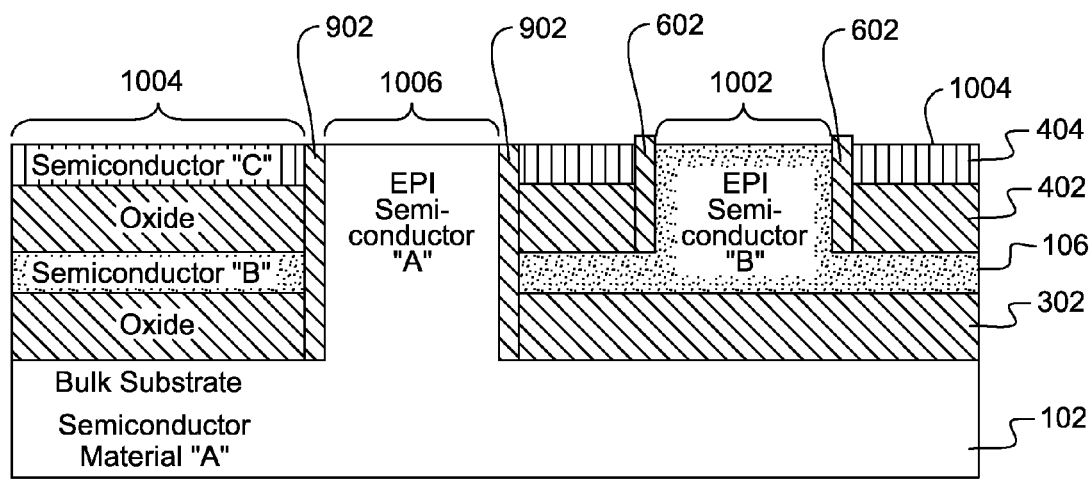
FIG. 10 is a view of the FIG. 9 fragment shown at a processing step subsequent to that of FIG. 9.

Continuing to refer to FIG. 4, a layer of nitride 406 (e.g., 10 nm-100 nm) followed by a layer of oxide 408 (e.g., 2 nm-20 nm) are deposited on the surface of semiconducting material 404. The nitride layer 406 and the oxide layer 408 will subsequently serve as polish stop/marker layers for the planarization and polishing of semiconducting regions in a final structure as illustrated in FIG. 10.

Figure 5:
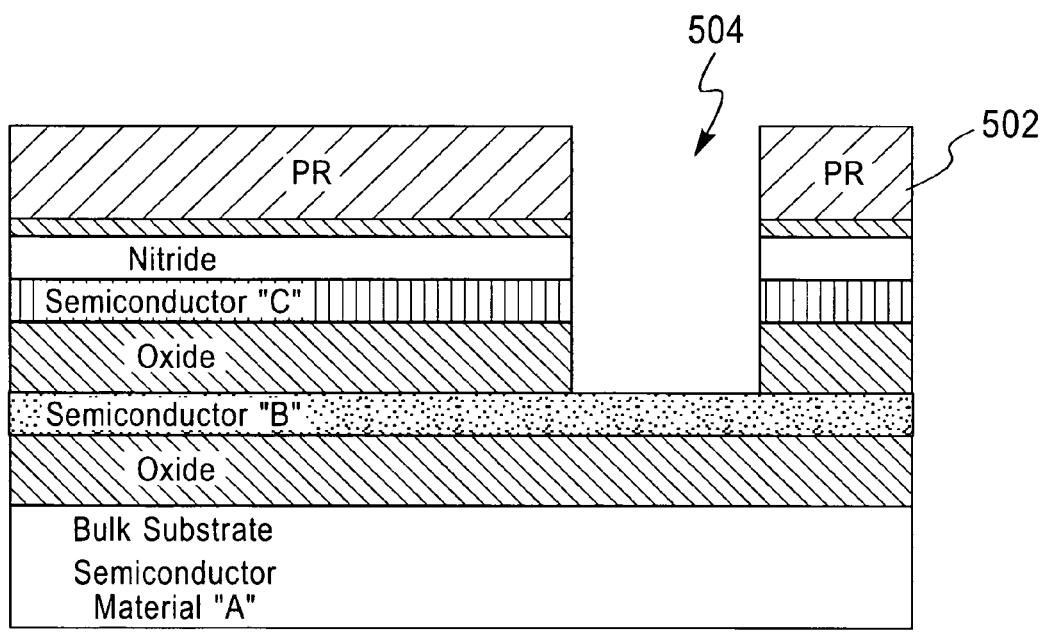
FIG. 5 is a view of the FIG. 4 fragment shown at a processing step subsequent to that of FIG. 4.

FIG. 5 is a view of the FIG. 4 fragment shown at a processing step subsequent to that of FIG. 4. A layer of photoresist 502 is applied and patterned over the oxide layer 408. An anisotropic etch is then performed through the upper dielectric layers (e.g., 408, 406), semiconducting material 404 (e.g., semiconductor C), and through the oxide layer 402 located between semiconducting material layers 404 and 106 to form a first opening 504. Etching of the oxide layer 402 is RIE selective to semiconducting material 106 (e.g., semiconducting material B). The opening 504 can be in the form of a via extending to an upper surface of the semiconducting material 106 (e.g., semiconducting material B), and the opening 504 can be in the shape of a slot.

Figure 5A:
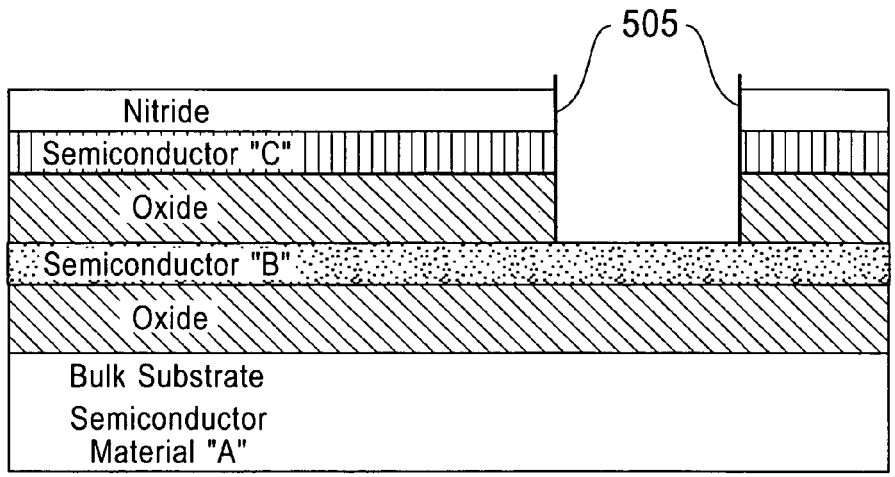
FIG. 5A is a view of the FIG. 5 fragment shown at a processing step subsequent to that of FIG. 5.

FIG. 5A is a view of the FIG. 5 fragment shown at a processing step subsequent to that of FIG. 5 wherein the photoresist layer 502 is stripped, and nitride spacers 505 are formed on the sidewalls of the opening 504. The thickness of the nitride spacers 505 can be in the range of 1 nm-10 nm and well known methods such as, for example, conformal nitride deposition followed by reactive ion etching (RIE) can be used to form the nitride spacers 505.

Figure 5B:
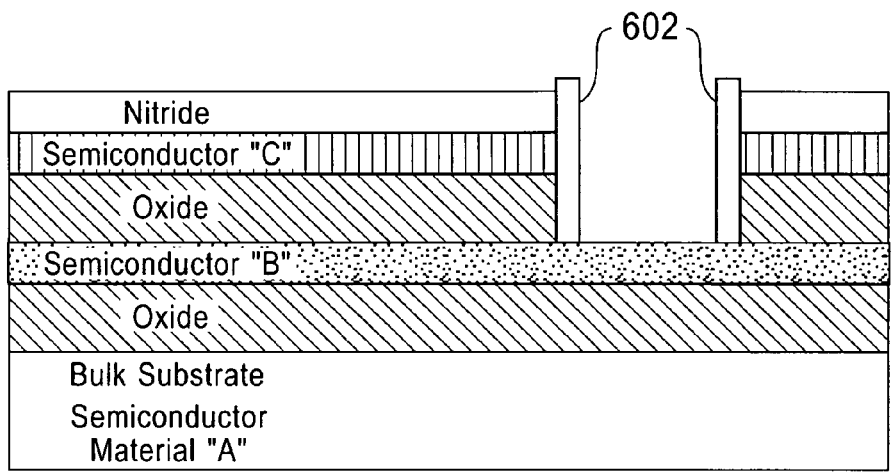
FIG. 5B is a view of the FIG. 5A fragment shown at a processing step subsequent to that of FIG. 5A.
Figure 5C:
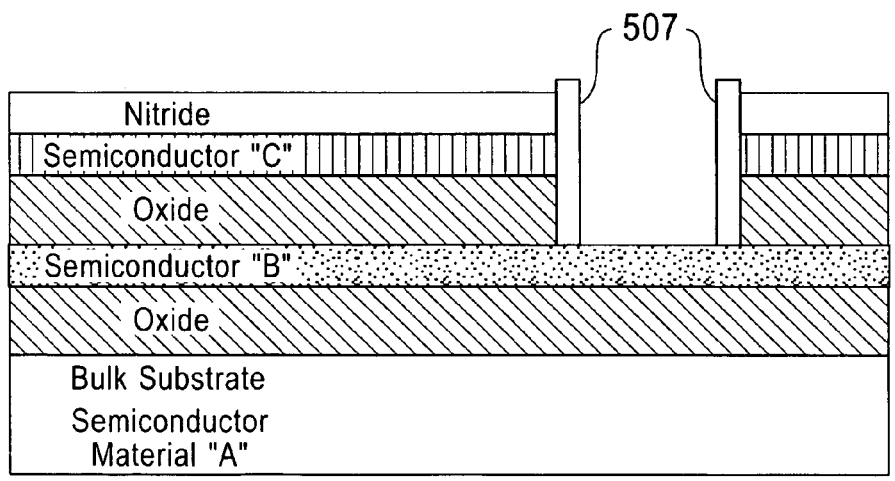
FIG. 5C is a view of the FIG. 5B fragment shown at a processing step subsequent to that of FIG. 5B.

FIG. 5B is a view of the FIG. 5A fragment shown at a processing step subsequent to that of FIG. 5A wherein a layer of CVD oxide is deposited and etched (e.g., RIE) to form oxide spacers 602. The thickness of the deposited oxide layer and oxide spacers 602 is preferably in the range of 10 nm-200 nm. An additional set of nitride spacers 507 is formed on the sidewalls of the oxide spacers 602 and as shown in FIG. 5C in a similar fashion to that of nitride spacers 505 as described at FIG. 5A. Thus, in the embodiment illustrated in FIG. 5C, the oxide spacers 602 are sandwiched between the nitride spacers 505 and 507.

Figure 6:
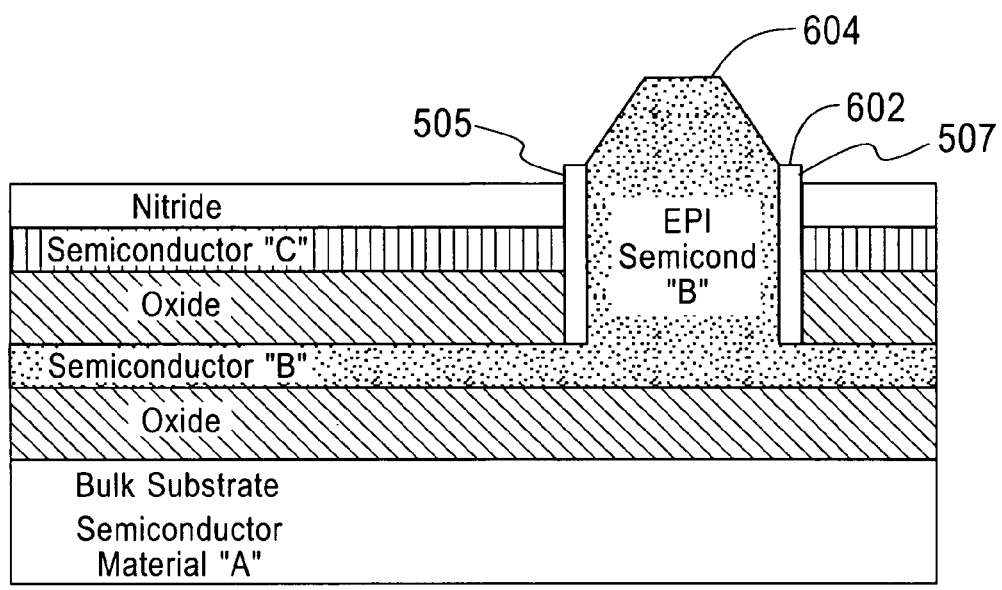
FIG. 6 is a view of the FIG. 5C fragment shown at a processing step subsequent to that of FIG. 5C.

FIG. 6 is a view of the FIG. 5C fragment shown at a processing step subsequent to that of FIG. 5C wherein the exposed surface of semiconducting material 106 serves as a seed layer for the selective epitaxial growth of semiconducting material 106 in the opening 504. The epitaxially grown semiconductor material in opening 504 is identified using reference numeral 604.

Figure 7:
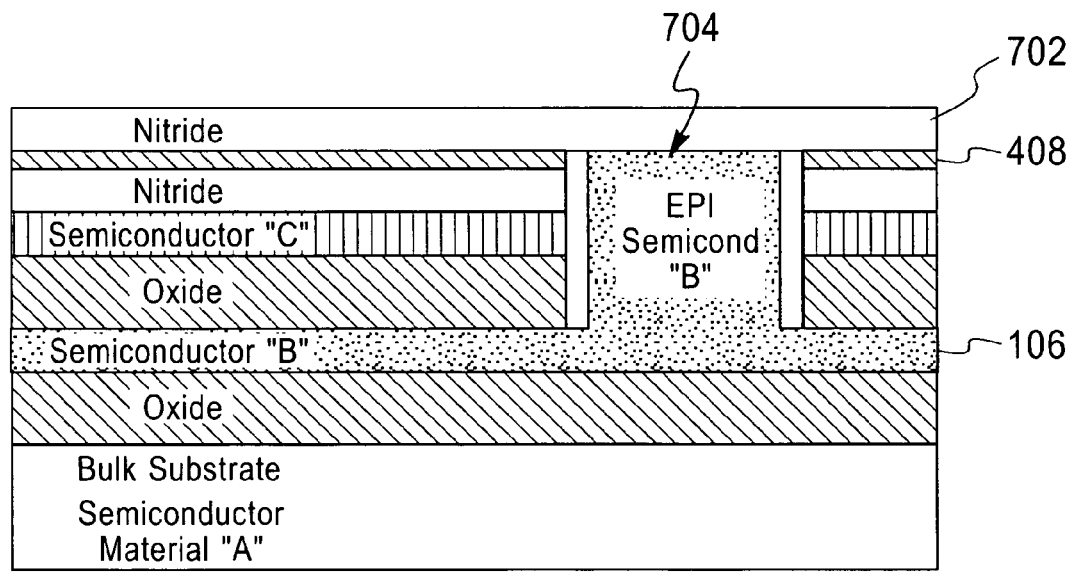
FIG. 7 is a view of the FIG. 6 fragment shown at a processing step subsequent to that of FIG. 6.

Referring to FIG. 7, the semiconducting material 106 (e.g., seed layer 106) that is epitaxially grown in the opening 504 is planarized substantially to the top surface of the upper oxide layer 408. The planarization process may slightly thin oxide layer 408. A CVD nitride layer 702 (e.g., 10 nm-100 nm thick) is then deposited over the oxide layer 408 and the top surface 704 of the epitaxially grown semiconductor material 106 in order to form a nitride cap layer.

Figure 9:
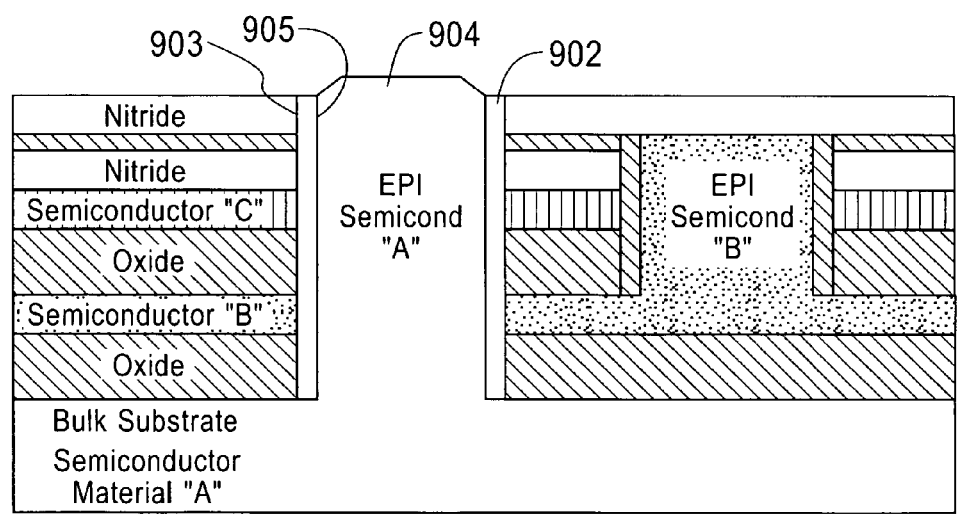
FIG. 9 is a view of the FIG. 8 fragment shown at a processing step subsequent to that of FIG. 8.

Such capping allows a different type of semiconductor material to be grown (as illustrated in FIG. 9) without disturbing the surface of semiconductor material 604. It will be appreciated that semiconducting materials used for layers 106 and 604 are same.

Figure 8:
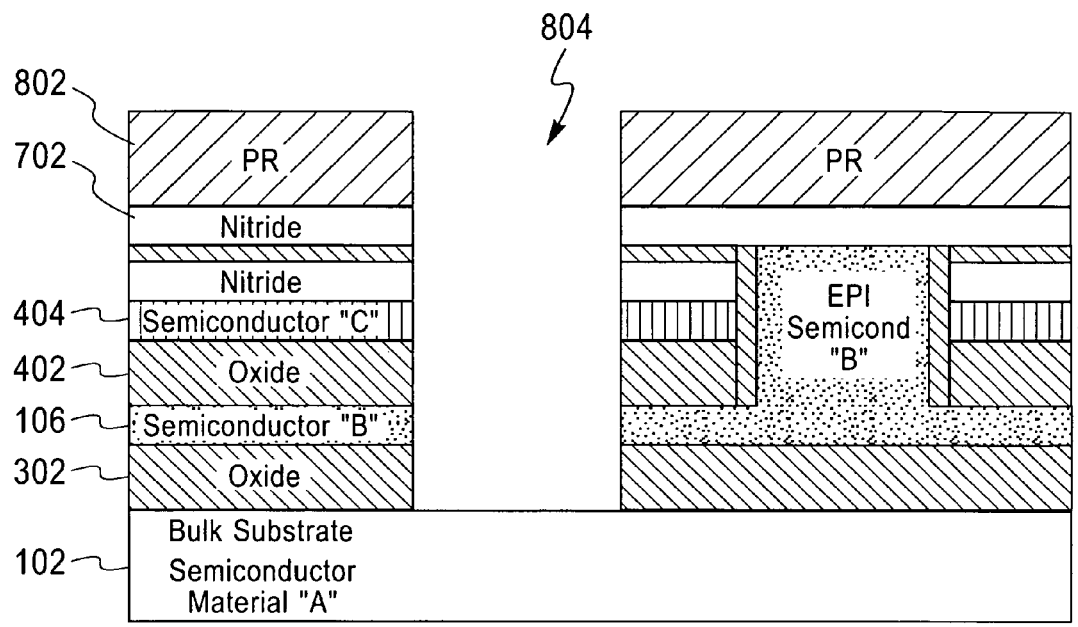
FIG. 8 is a view of the FIG. 7 fragment shown at a processing step subsequent to that of FIG. 7.

Once the surface 704 of the semiconductor material 106 is capped, epitaxial growth of the semiconductive material 102 is performed as will be illustrated with respect to FIGS. 8-9. As noted above, reference numeral 604 is used merely to identify the epitaxially grown portion of the semiconductor material 106. Such capping with the nitride layer (e.g., nitride cap layer) prevents nucleation of material of the semiconductor material 102 (e.g., semiconductor material A) on an exposed surface (e.g., epitaxial region 604 and surface 704) of the semiconductor material 106 (e.g., semiconductor material B), thereby preventing downward propagation of crystal defects into the semiconductor material 106.

Referring to FIG. 8, a new layer of photoresist 802 is applied and patterned over the nitride layer 702. Recesses are anisotropically etched into the exposed regions of the substrate to form a second opening 804. Etching is performed through the upper dielectric layers, semiconducting material layer 404 (e.g., semiconducting material C), its back oxide layer 402, semiconducting layer 106 (e.g., semiconducting layer B) and through the lower CVD oxide layer 302. The RIE of the lower CVD oxide 302 is selective to the semiconducting material layer 102 (e.g., semiconducting material A).

Referring to FIG. 9, the photoresist layer 802 is stripped, and layers of CVD nitride, oxide, and nitride are sequentially deposited in the opening 804 and etched (e.g., RIE etched) to form nitride spacers 903 and 905, and oxide spacers 902 on the sidewalls of the opening 804. In the embodiment illustrated in FIG. 9, oxide spacers 902 are sandwiched between the nitride spacers 903 and 905. Spacers are formed in a manner similar to the formation of spacers described with respect to FIGS. 5A through 5C. Then, the exposed surface of semiconducting substrate 102 serves as a seed layer for the selective epitaxial growth of semiconducting material 102. The epitaxially grown semiconductor material in opening 804 is identified using reference numeral 904.

The upper surface of the semiconductor construction shown in FIG. 9 is then planarized and polished. In the course of polishing, the upper nitride layer 702 is first removed. Then, the polishing operation continues through the thin oxide layer 408 over the lower nitride layer 406. When polishing has gone through the oxide layer 408, the signature of the lower nitride layer 406 is detected, and the polish rate is reduced such that the nitride layer 406 is substantially removed and overpolish of semiconducting material 404 (e.g., semiconducting material C) is avoided. Any remaining nitride is etched away.

FIG. 10 is a view of the structure after polishing and planarization performed on the fragment shown in FIG. 9. As it is apparent, the structure of FIG. 10 illustrates a first semiconductor region 1002, a second semiconductor region 1004, and a third semiconductor region 1006. The first, second, and third semiconductor regions 1002, 1004, and 1006 are coplanar and electrically insulated by laterally adjacent insulator regions 602, 902, respectively.

Figure 11:
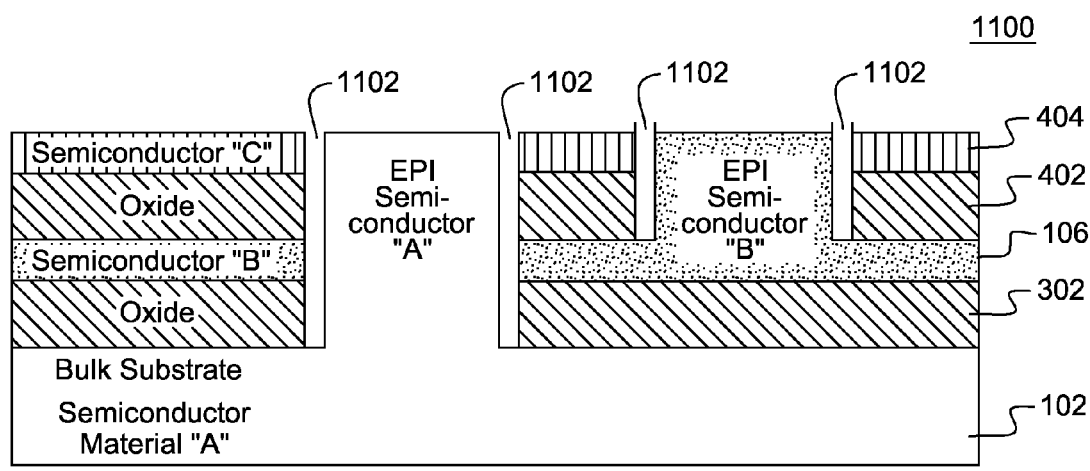
FIG. 11 is a view of the FIG. 10 fragment shown at a processing step subsequent to that of FIG. 10.

Referring to FIG. 11, a view of the structure 1100 subsequent to that of FIG. 10 is shown wherein the exposed oxide in the spacers 602 and 902 is etched out selective to nitride portions (e.g., 505, 507, 903, 905) and semiconductor. Either an isotropic or an anisotropic etch can be used for the oxide portions as they are bound by the nitride portions. Thus, the resulting structure 1100 includes gaps 1102 (e.g., lateral void gap regions) between the semiconductor regions 1002, 1004, and 1006.

Figure 12:
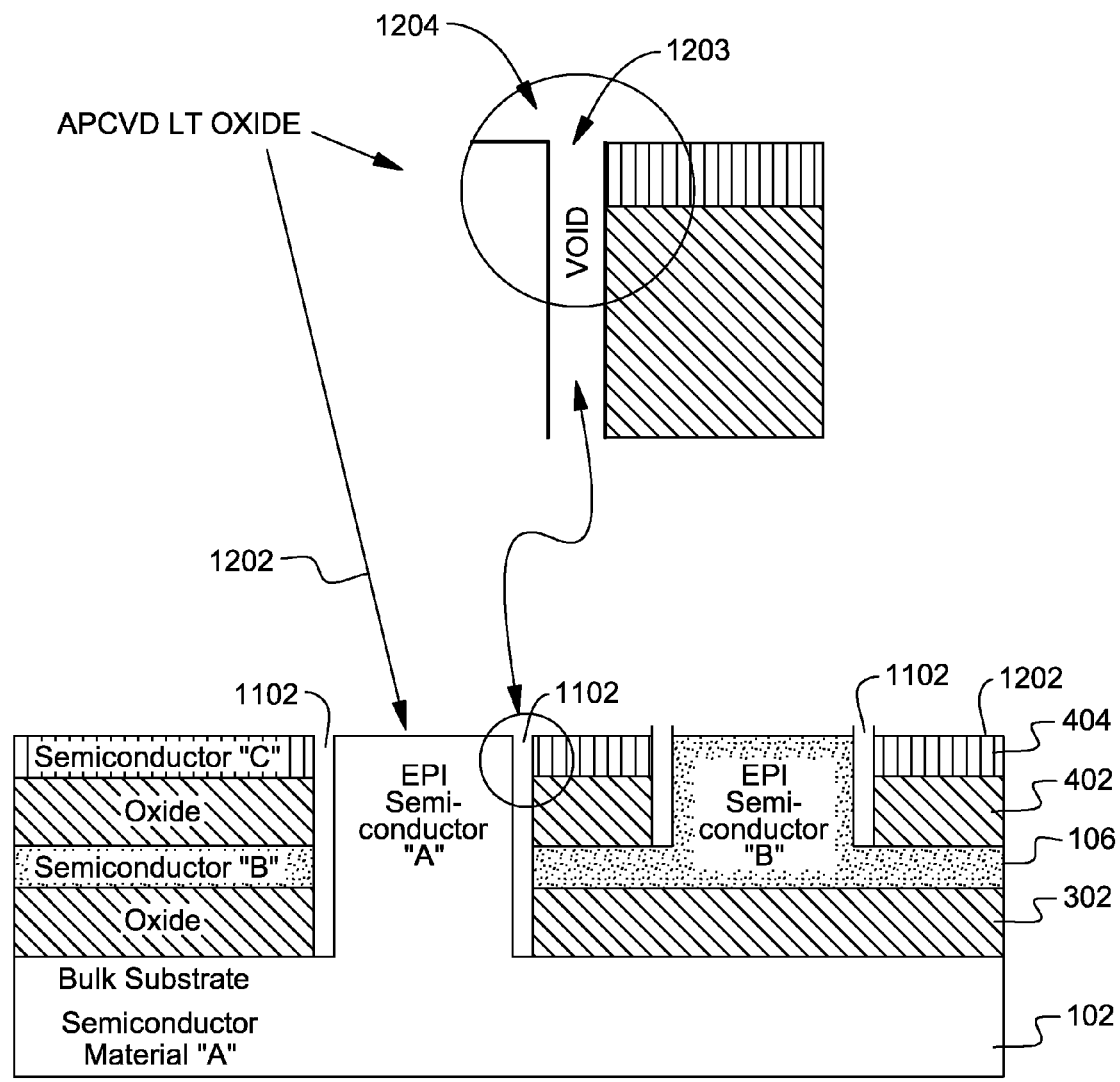
FIG. 12 is a view of the FIG. 11 fragment shown at a processing step subsequent to that of FIG. 11.

FIG. 12 is a view of the FIG. 11 fragment shown at a processing step subsequent to that of FIG. 11 wherein a layer of CVD oxide 1202 is deposited such that top portions of gaps 1102 are plugged. By using a low-temperature (e.g., of about 450 degrees C.) atmospheric pressure CVD (APCVD) oxide deposition, a "bread loaf" oxide shape 1204 is formed at the edges of the gaps 1102 thereby enabling sealing the top portions of the gaps 1102.

At atmospheric pressure, the mean free path of the deposited material can be very short, thereby randomizing the deposition of the material. With random spatial deposition, the corners of the gaps 1102 will deposit faster relative to flat surfaces, thus leading to the "bread loaf" effect. Further, the low temperature of the deposition reduces the diffusivity of the deposited oxide. Thus, once the oxide is deposited, it remains in place within the gaps near the top portions thereof forming plugs 1203.

Figure 13:
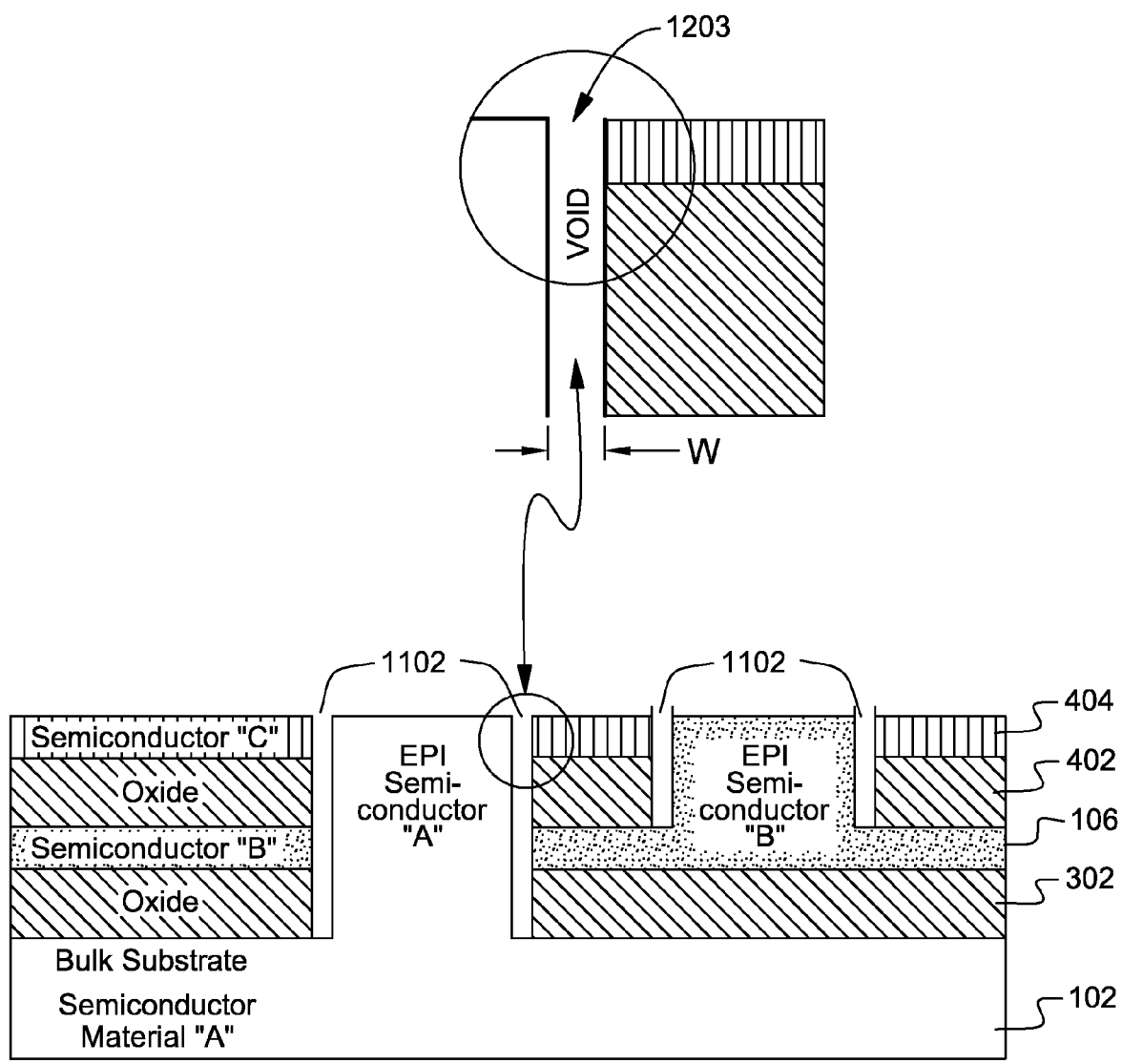
FIG. 13 is a view of the FIG. 12 fragment shown at a processing step subsequent to that of FIG. 12.

FIG. 13 is a view of the FIG. 12 fragment shown at a processing step subsequent to that of FIG. 12. The deposited oxide layer 1202 is polished off the planar surface, leaving the gaps (e.g., voids) 1102 sealed with the oxide plugs 1203. With the gaps 1102 between the semiconductor regions 1002, 1004, and 1006, crystal damage due to a thermal mismatch during subsequent processing is reduced. The preferred thickness of the CVD oxide layer 1202 (FIG. 12) should preferably be equal to or greater than the width "w" of the gaps. The gap "w" is pinched off by the breadloafing effect before the deposited thickness is equal to half the gap width "w".

In one embodiment, the first and second semiconductor regions 1002, 1004 are protected while processing the third semiconductor region 1006. It will be appreciated that the first, second, and third regions are merely exemplary. More or less number of semiconductor regions can be created using the methodology described in FIGS. 1-9.

In an alternate embodiment, in the scenario where all the semiconductor regions are made of silicon, the inside surfaces of the semiconductor material in the gaps (e.g., gaps 1102) may be oxidized to remove or heal damage from the epi (e.g., 604, 904).

Figure 14:
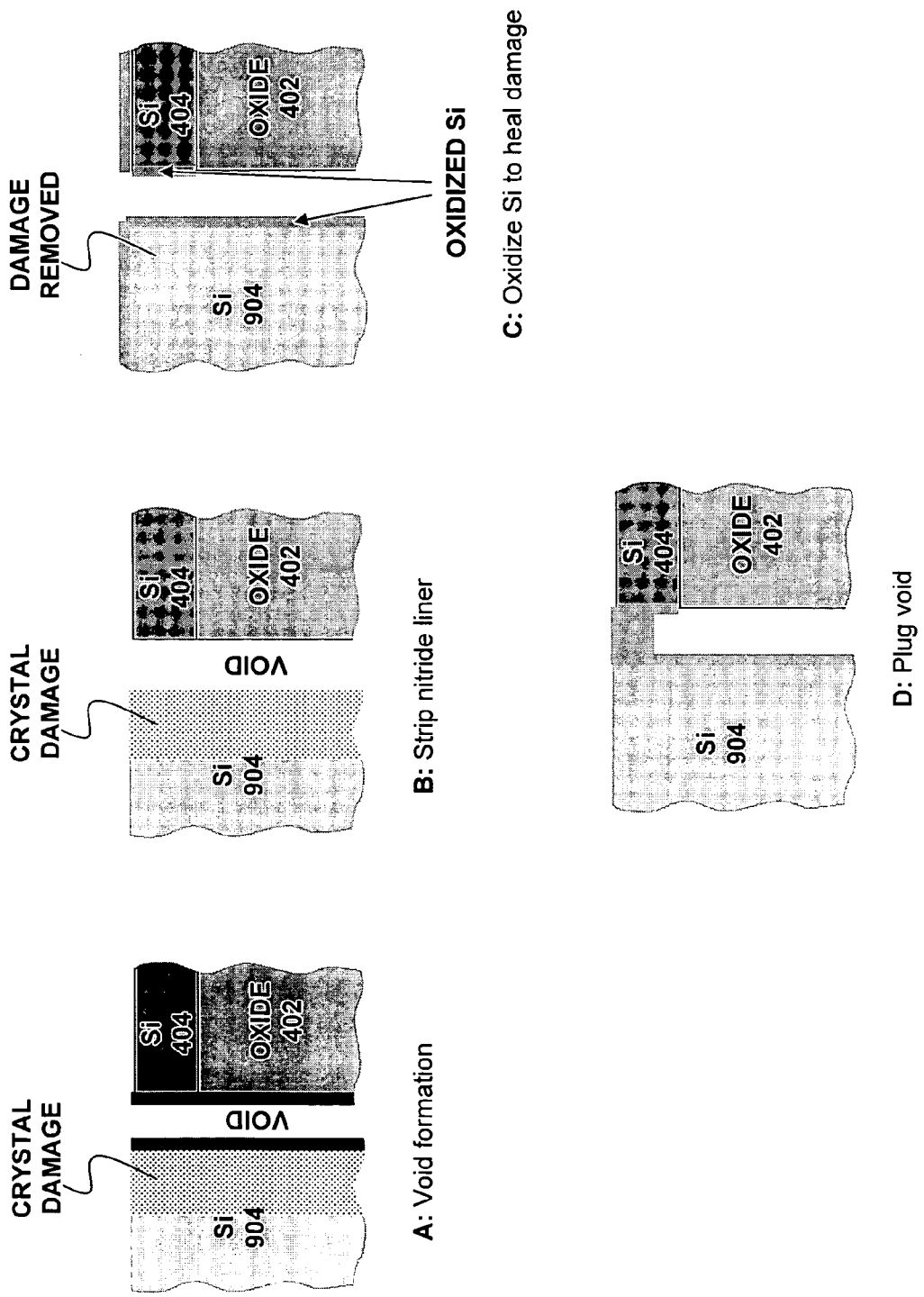
FIG. 14 shows an alternate embodiment of the invention.

Referring to FIG. 14, prior to oxidation, the nitride spacers or nitride portions (e.g., 505, 507, 903, 905) are removed to gain access to the silicon surface. The grown oxide can be kept thin enough such that the gap would not close. Alternatively, the gap width "w" can be increased to prevent closure. This can be a desirable option in the process to remove the sidewall dislocations. The gaps (e.g., 1102) can then be plugged using the process steps described above with respect to FIGS. 12-13.

Figure 15:
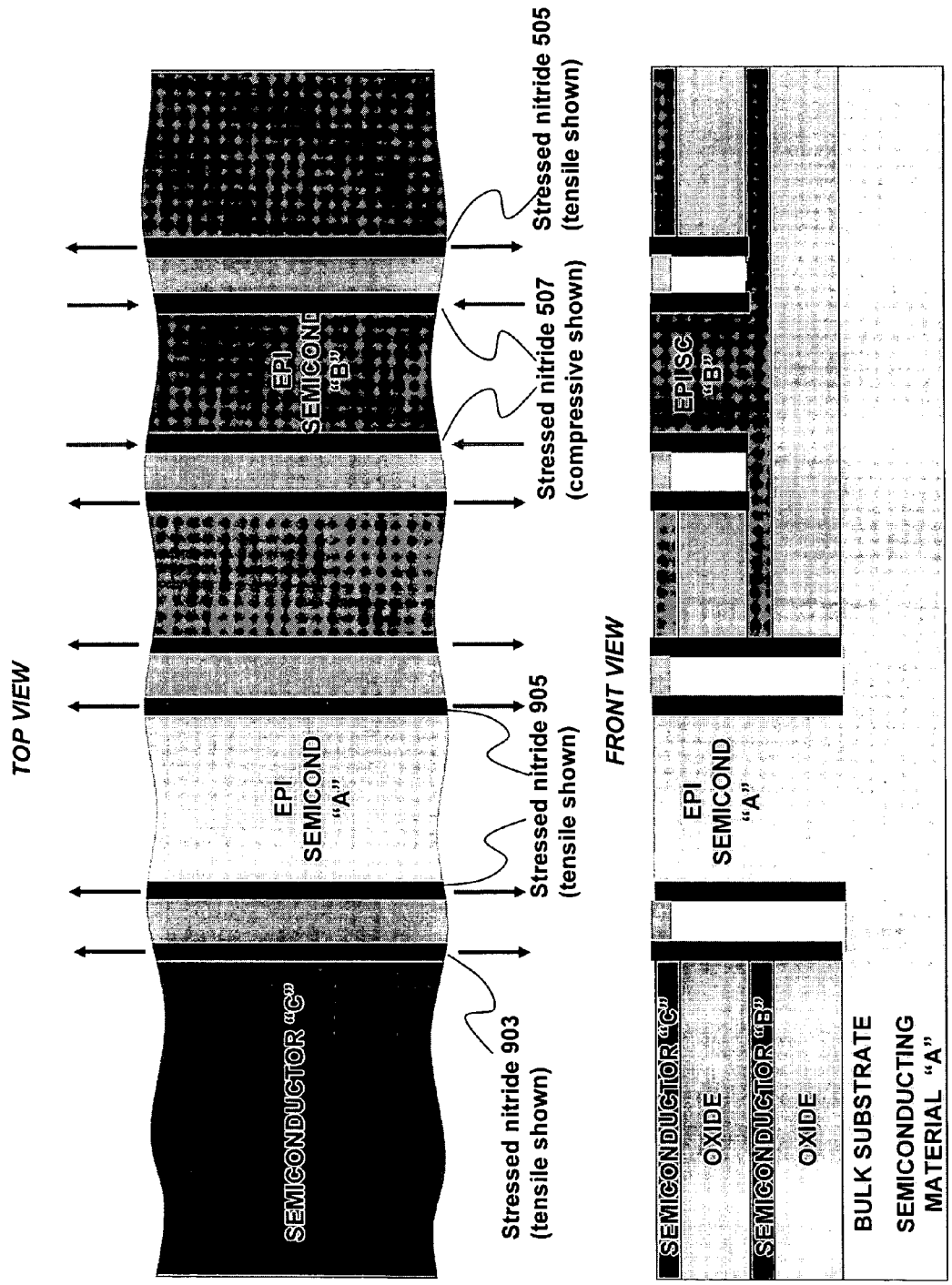
FIG. 15 shows top and front views of the semiconductor construction illustrated in FIG. 13, the top view identifying tensile and compressive stresses in the construction.

In another embodiment, a wider gap (e.g., "w") may be used to facilitate deposition of the sidewall nitride portions (e.g., 505, 507, 903, 905). Deposition conditions for depositing the nitride portions can be adjusted to produce compressive or tensile stresses tangential to the sidewall of the epi As shown in the top view of FIG. 15, nitride layer 507 on the sidewalls of epi material at region 1002 (e.g., semiconductor B) was deposited to produce a compressive stress. On the other hand, the deposition conditions for nitride liners 505, 903, and 905 on the sidewalls of material at region 1004 (e.g., semiconductor "C") and epi material at region 1006 (e.g., semiconductor "A") were adjusted to produce a tensile stress. Nitride film deposition conditions for producing compressive or tensile stresses are known to those of ordinary skill in the art and are not elaborated on here. Such may be useful for modulating the carrier mobilities for electrons and holes. Optionally, materials other than the nitride may be used for the nitride portions to produce the desired stress characteristics. The gap width ("w") and the thickness of the nitride layer (e.g., 505, 507, 903, 905) can be selected such that the gap 1102 would not be pinched off. The gap can then be plugged using the process steps described in FIGS. 12-13.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:
    providing a substrate;
    forming a plurality of semiconductor layers in the substrate, each of the semiconductor layers being distinct and selected from different groups of semiconductor element types, the semiconductor layers comprising first, second, and third semiconductor layers; and
    forming a plurality of lateral void gap isolation regions for isolating portions of each of the semiconductor layers from portions of the other semiconductor layers; wherein said step of forming each of the plurality of lateral void gap isolation regions comprises:
        forming a first nitride spacer layer on the sidewalls of an aperture;
        depositing an oxide layer on the first nitride spacer layer;
        forming a second nitride spacer layer on the oxide layer such that the oxide layer is sandwiched between the first nitride spacer layer and the second nitride spacer layer; and
        etching the oxide layer in order to create a void between the first and second nitride spacer layers, the etching being conducted selective to the first and second nitride spacer layers and adjacent semiconductor layers.

2. The method of claim 1, wherein the width of each of the lateral void gap isolation region and forming conditions of the first and second nitride spacer layers are adjusted to prevent pinchoff of the lateral void gap isolation region.

3. The method of claim 2, wherein the thickness of the oxide layer deposited over each lateral void gap isolation region is greater than the width of the lateral void gap isolation region.

4. The method of claim 2, wherein the thickness of the oxide layer deposited over each lateral void gap isolation region is equal to the width of the lateral void gap isolation region.

5. A semiconductor processing method, comprising:
    providing a substrate;
    forming a plurality of semiconductor layers in the substrate, each of the semiconductor layers being distinct and selected from different groups of semiconductor element types, the semiconductor layers comprising first, second, and third semiconductor layers;

forming a plurality of lateral void gap isolation regions for isolating portions of each of the semiconductor layers from portions of the other semiconductor layers;

wherein a plurality of semiconductor regions are formed in the substrate by the forming of the plurality of semiconductor layers, the plurality of semiconductor regions comprising first, second, and third semiconductor regions; and forming a nitride cap layer on the second semiconductor layer prior to forming the third semiconductor layer, and wherein the first, second, and third semiconductor layers comprise materials of dissimilar semiconductor element types;

wherein said nitride cap layer prevents nucleation of material of the third semiconductor layer on an exposed surface of the second semiconductor layer, thereby preventing downward propagation of crystal defects into the second semiconductor layer.

6. A semiconductor construction, comprising:

a semiconductor substrate;

a plurality of semiconductor layers provided in the semiconductor substrate, each of the semiconductor layers being selected from different groups of semiconductor element types;

a plurality of semiconductor regions formed from the plurality of semiconductor layers, the plurality of semiconductor regions have coplanar top surfaces;

a nitride cap layer formed over a previously formed semiconductor layer, from among the plurality of the semiconductor layers, prior to growth of another semiconductor layer over the previously formed semiconductor layer; and a plurality of lateral void gap isolation regions, each of the lateral void gap isolation regions being formed in an aperture in the semiconductor substrate and configured to isolate portions of each of the semiconductor layers from portions of the other semiconductor layers;

wherein each of the plurality of lateral void gap isolation regions comprises
- a first nitride spacer layer formed on the sidewalls of the aperture;
- a second nitride spacer layer formed over the first nitride spacer layer leaving a gap having a width "w" in between the first and second nitride spacer layers.

7. The semiconductor construction of claim 6, wherein the nitride cap layer prevents downward propagation of crystal defects into a earlier formed semiconductor layer during formation of another semiconductor layer.

* * * * *